(12) United States Patent
Björklund et al.

(10) Patent No.: US 8,738,331 B2
(45) Date of Patent: May 27, 2014

(54) INCREASED RELIABILITY IN THE PROCESSING OF DIGITAL SIGNALS

(75) Inventors: Hans Björklund, Ludvika (SE); Krister Nyberg, Smedjebacken (SE)

(73) Assignee: ABB Technology AG, Zurich (CH)

( * ) Notice: Subject to any disclaimer, the term of this patent is extended or adjusted under 35 U.S.C. 154(b) by 827 days.

(21) Appl. No.: 12/663,375

(22) PCT Filed: Jun. 4, 2008

(86) PCT No.: PCT/EP2008/056905
§ 371 (c)(1),
(2), (4) Date: Jul. 22, 2010

(87) PCT Pub. No.: WO2008/148793
PCT Pub. Date: Dec. 11, 2008

(65) Prior Publication Data
US 2010/0289551 A1 Nov. 18, 2010

Related U.S. Application Data

(60) Provisional application No. 60/924,999, filed on Jun. 7, 2007.

(51) Int. Cl.
*H04B 15/04* (2006.01)

(52) U.S. Cl.
USPC .................. 702/189; 702/57; 702/58; 702/66

(58) Field of Classification Search
USPC ............................................. 702/58, 63, 189
See application file for complete search history.

(56) References Cited

U.S. PATENT DOCUMENTS

| 3,543,159 | A | 11/1970 | Slayden et al. |
| 4,126,825 | A | 11/1978 | Houston et al. |
| 6,144,326 | A * | 11/2000 | Krone et al. .................. 341/118 |
| 6,816,816 | B2 | 11/2004 | Slates et al. |
| 2004/0070529 | A1* | 4/2004 | Kamas et al. ................. 341/155 |
| 2004/0158435 | A1 | 8/2004 | Slates et al. |
| 2005/0134244 | A1* | 6/2005 | Sanzo et al. .................. 323/283 |
| 2005/0160327 | A1 | 7/2005 | Baig et al. |
| 2005/0179576 | A1 | 8/2005 | Tarui et al. |

OTHER PUBLICATIONS

Measurement of an Analog Signal's Rise and Fall Times; Research Disclosure; Mason Publications; vol. 328, No. 92; Aug. 1991; 2 pages.
PCT/ISA/210—International Search Report—Sep. 3, 2008.

(Continued)

*Primary Examiner* — Mischita Henson
(74) *Attorney, Agent, or Firm* — Birch, Stewart, Kolasch & Birch, LLP

(57) ABSTRACT

A method, device and computer program product for providing increased reliability in the processing of digital signals. The device includes a module for performing analog measurement of a received signal intended to occupy two logical states at various instances in time, a module for determining if there is a change in the analog signal level, a module for determining if the change fulfills at least one logical state change condition, wherein a first logical state change condition is based on the speed of change of the analog signal level, and a module for determining that there is a change from one logical state to the other if at least one logical state change condition is fulfilled. The invention provides secure detection of unreliable digital signals that may be generated in harsh environments that are polluted or moist.

28 Claims, 3 Drawing Sheets

(56) References Cited

OTHER PUBLICATIONS

PCT/IPEA/409—International Preliminary Report on Patentability—Oct. 1, 2009.

PCT/ISA/237—Written Opinion of the International Searching Authority—Sep. 3, 2008.

* cited by examiner

INCREASED RELIABILITY IN THE PROCESSING OF DIGITAL SIGNALS

CROSS-REFERENCE TO RELATED APPLICATIONS

This application claims priority to U.S. provisional patent application 60/924,999 filed 7 Jun. 2007 and is the national phase under 35 U.S.C. §371 of PCT/EP2008/056905 filed 4 Jun. 2008.

FIELD OF INVENTION

The present invention relates to a method, device and computer program product for providing increased reliability in the processing of digital signals.

BACKGROUND

Time varying signals that are intended to occupy two logical states at various instances in time and therefore intended to reflect changes between two logical states, i.e. signals that are digital in nature, can be provided in a number of various environments where they are not reliable. This is especially the case in for instance systems for controlling electrical processes, such as for controlling generation and transmission of electrical power, i.e. high-voltage power transmission and generation systems, where a lot of system elements and devices for controlling such system elements may be provided in polluted or moist environments.

A digital contact transducer that is located in such a polluted or moist environment may for instance provide a rather low resistance, even when a contact of the transducer is open. If such a transducer is used for generating a digital signal, the transducer may in fact provide a signal that does not correctly reflect the logical state that is intended. In power transmission systems this may for example lead to the shutting down of power transmission. Such transducers should of course be designed to be resistant to moisture in the environment. However, also other aspects have to be considered, such as cost. The problem can therefore unfortunately not be 100% avoided.

In case the element in the system that causes the generation of the signal is floating or ungrounded or high impedance grounded, which may be the case with for instance a battery system in an electrical power transmission system, a ground fault may lead to a detection of a signal level that does not correctly represent the signal generated.

There is therefore a need for improvement in relation to these types of situations.

U.S. Pat. No. 6,816,816 describes a transducer fault detection system that transforms transducer measurements into slew rate measurements, and determines which, if any, of these measurements are anomalous. The change in slew rate is here furthermore detected through comparing sampled digitized voltage samples with a defined voltage window.

CA 1102879 describes comparing analog data in a slow channel and corresponding to the current in a power line of a power transmission system with data of a fast channel also corresponding to the current in the power line. There is no discussion about errors in logical states.

There is therefore a need for an improvement in the detection of the logical states intended to be provided by a signal.

SUMMARY OF THE INVENTION

The present invention is generally directed towards providing an increased reliability in the detection of digital signals.

According to the principles of the present invention a digital representation of an analogously measured signal intended to occupy two logical states at various instances in time is received. A determination is then made of if there is a change in the analog signal level. In case there is such a change, a further determination is made regarding if the change fulfills at least one logical state change condition. A first logical state change condition is here based on the speed of change of the analog signal level. If at least one logical state change condition is fulfilled then a determination is made that there is a change from one logical state to the other.

One object of the present invention is therefore to provide a method for providing increased reliability in the processing of digital signals, which improves the detection of the logical states intended to be provided by such signals.

This object is according to a first aspect of the present invention solved through a method for providing increased reliability in the processing of digital signals and comprising the steps of:
  receiving a signal intended to occupy two logical states at various instances in time,
  performing an analog measurement of the signal,
  determining if there is a change in the analog signal level,
  determining if the change fulfills at least one logical state change condition, where a first logical state change condition is based on the speed of change of the analog signal level, and
  determining that there is a change from one logical state to the other if at least one logical state change condition is fulfilled.

Another object of the present invention is to provide a device for providing increased reliability in the processing of digital signals, which improves the detection of the logical states intended to be provided by such signals.

This object is according to a second aspect of the present invention solved through a device for providing increased reliability in the processing of digital signals and comprising:
  means for performing analog measurement of a received signal intended to occupy two logical states at various instances in time,
  means for determining if there is a change in the analog signal level,
  means for determining if the change fulfills at least one logical state change condition, where a first logical state change condition is based on the speed of change of the analog signal level, and
  means for determining that there is a change from one logical state to the other if at least one logical state change condition is fulfilled.

Another object of the present invention is to provide a computer program product provided on a data carrier for providing increased reliability in the processing of digital signals, which improves the detection of the logical states intended to be provided by such signals.

This object is according to a third aspect of the present invention solved through a computer program product provided on a data carrier for providing increased reliability in the processing of digital signals, and comprising computer program code to make a processing unit perform, when said code is loaded into said processing unit
  receiving a digital representation of an analogously measured signal intended to occupy two logical states at various instances in time,
  determining if there is a change in the analog signal level, determining if the change fulfills at least one logical state change condition, where a first logical state change condition is based on the speed of change of the analog signal level, and determining that there is a change from one logical state to the other if at least one logical state change condition is fulfilled.

The present invention has a number of advantages. It allows very secure detection of signals from signal generating devices providing unreliable digital signals, for instance when these devices are provided in harsh environments that may be polluted or moist. It is furthermore insensitive to ground faults on ungrounded or midpoint grounded system elements.

BRIEF DESCRIPTION OF THE DRAWINGS

The present invention will in the following be described with reference being made to the accompanying drawings, where FIG. 1 schematically shows an element in a power transmission system being connected, via a signal transducer, to a device for providing increased reliability in the processing of digital signals according to a first embodiment of the present invention, FIG. 2 schematically shows a voltage divider and filter unit.

DETAILED DESCRIPTION OF THE INVENTION

In the following, a detailed description of preferred embodiments of a device and a method according to the present invention will be given.

The present invention may be provided in a system, which is to be controlled and protected. Such systems include systems for generation and transmission of electrical DC or AC power, i.e. high-voltage or ultra high-voltage power transmission and generation systems. The invention is furthermore not limited to such systems, but may be implemented in other types of systems, like pulp and paper production systems.

In order to protect and control such systems, there is a need to obtain signals from various sources or elements and act on these signals. These systems do furthermore need to be reliable. This means that the signals, which protection and control devices of the system act upon, have to be correct.

At the same time many of the elements for which such signals are emitted are provided in environments that are not ideal. They and devices arranged to generate signals in relation to these elements, may for instance be subject to pollution and/or moisture. This may affect the elements and also the signals that are generated for these elements. At the same time signals generated by such signal generating devices may need to be used even though the signal generating device in question does not function as it should. The present invention is directed towards raising the reliability of the handling of such unreliable signals.

Figure 1:
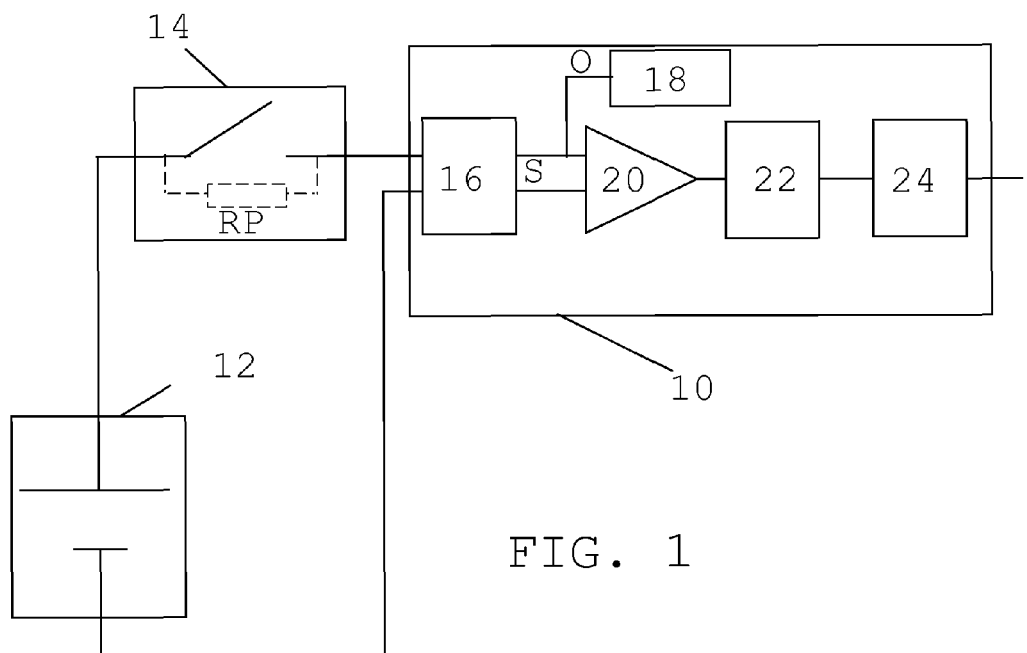

FIG. 1 shows an exemplifying system element 12, which is here a battery system element. One end of the system element 12 is here being connected to a signal generating device, which is here a digital signal transducer 14 including a contact that can be opened and closed. In the figure there can be seen a resistance RP, shown as a dashed box, in parallel with the contact. This resistance RP is a parasitic resistance caused by the harsh environment. The significance of this will be discussed shortly. The transducer 14 is here connected to a first input port of a device 10 for providing increased reliability in the processing of digital signals according to a first embodiment of the present invention. The other end of the system element 12 is connected to a second input port of the device 10.

Figure 2:
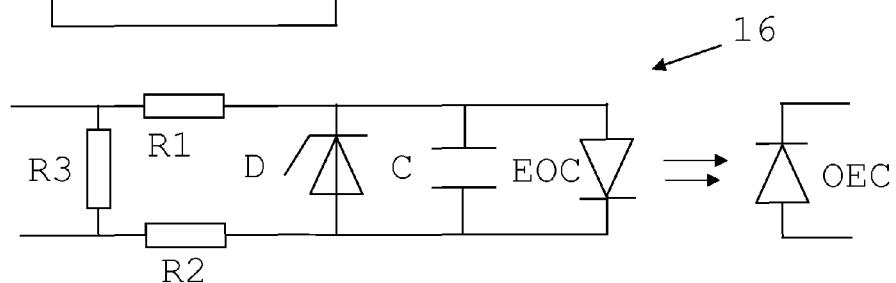

The device 10 includes a voltage divider and filter unit 16. This unit is shown in FIG. 2 and may include a first and second input resistor R1 and R2, the first ends of which are connected to a respective input port, a third input resistor R3 connected between the first and second input ports, a rectifying element D, such as a zener diode, connected between the second ends of the first and second input resistors R1 and R2 and directed towards the one R1 of the first and second input resistors that is connected to the transducer 14, a capacitance C in parallel with the rectifying element D and an electro-optical converting unit EOC, for instance in the form of a LED (light emitting diode), converting electrical signals to the optical domain. The electro-optical converting unit in turn emits optical signals to an opto-electrical converting unit OEC, which may be a photo-detector, for converting optical signals back to the electrical domain.

While again referring to FIG. 1, a voltage applied across the input ports of the device 10 is here thus divided and filtered and provided as a signal S by the voltage divider and filter unit 16. This signal S, which is a time varying signal, is then intended to provide information of the status of the system element 12, i.e. if it is connected or not, through occupying two logical states at various instances in time.

The voltage divider and filter unit 16 is in turn connected to a means for performing analog measurement of a received signal, which means in this embodiment is in the form of an amplifier 20, and here an isolation amplifier. To one input of this amplifier 20 there is here connected a means for adding an offset O to the measured signal S, i.e. an offset adding unit 18. This offset adding unit may here add an offset voltage to the voltage signal S. The amplifier 20 is in turn connected to a means for converting the measured signal S from an analog to a digital representation, which means may be realized through an A/D-converter 22. The A/D converter 22 is finally connected to a processing unit 24, which processing unit 24 may be realized in the form of a CPU.

As mentioned earlier, the transducer 14 is here intended to emit a time varying signal S intended to occupy two logical states at various instances in time. It is more particularly intended to provide a signal occupying one logical state when the contact is closed and another when the contact is open. Here the system element 12, the battery system, provides a voltage that may be 220 V. The system element 12 can furthermore be mid-point grounded through a high impedance. This means that one side of the battery system may be provided at −110 V and the other at +110 V. Alternatively the system element 12 can be ungrounded. When the contact of the transducer 14 is closed, the input ports of the device 10 receives a voltage of 220 V in both these cases, which is divided down and filtered by the voltage divider and filter unit 16. When the contact of the transducer 14 is open, no voltage should be applied across the input ports of the device 10 and therefore a zero voltage should ideally be obtained. In this way two logical states are obtained that should be reflected in the signal S.

The transducer 14 may, as was mentioned earlier, be provided in a harsh environment, including pollution and/or moisture. It may then get negatively influenced in that it may conduct current even if the contact is open. In such a situation there may therefore evolve a parasitic resistance RP in parallel with the contact. This means that a voltage will be applied across the input ports of the device 10, which may become large enough, due to pollution and/or moisture, to make the level of the signal S become large enough so that it can by mistake be taken as a signal indicating a closed contact. If this signal is only treated in conventional fashion, i.e. through comparing the signal level with a level threshold that separates one logical state from the other, there is a risk for the wrong state being detected. This may jeopardize the whole system. The present invention is provided for avoiding this and other undesirable situations.

Figure 3:
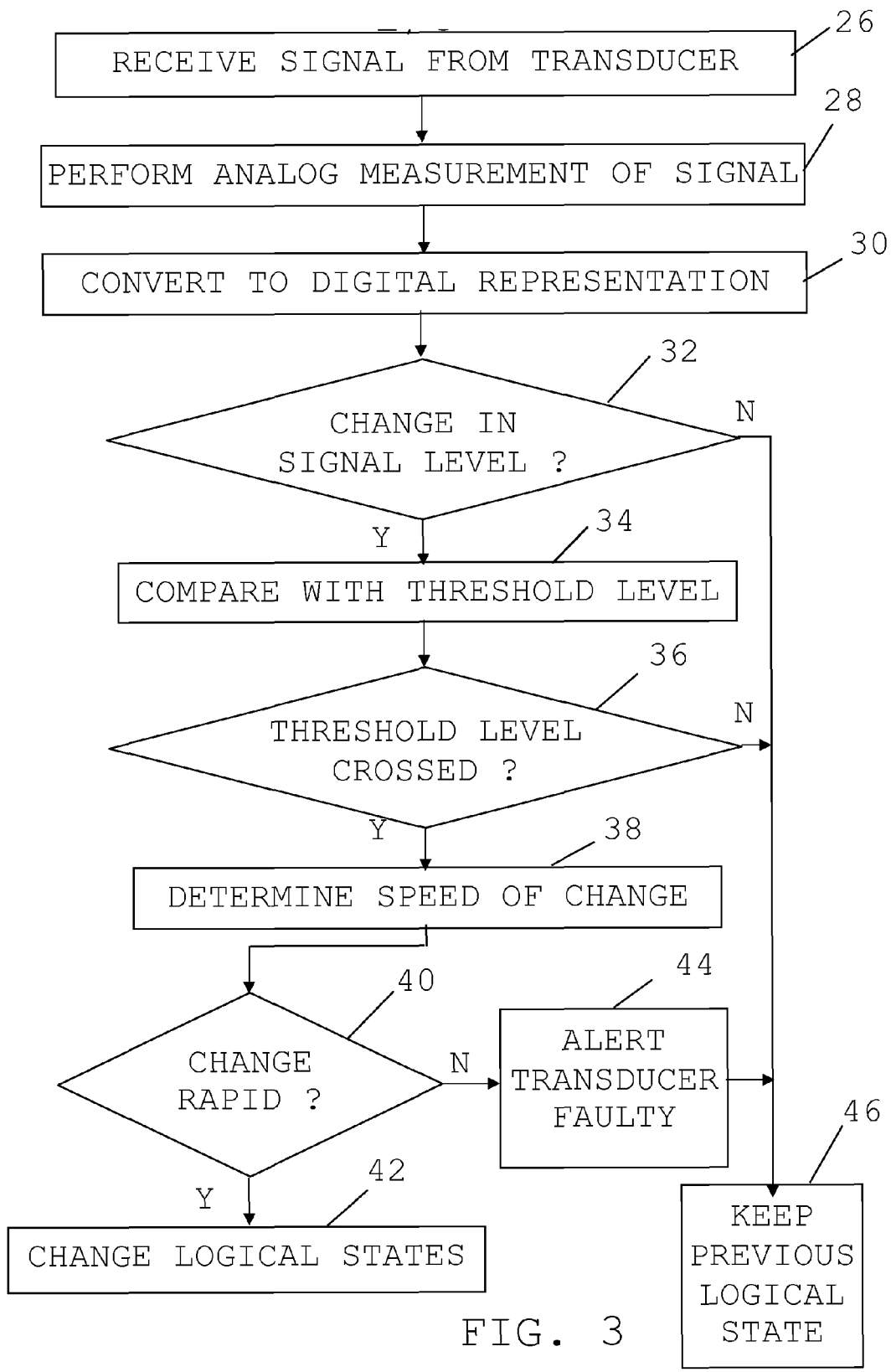
FIG. 3 shows a flow chart of a number of method steps being performed in a method for providing increased reliability in the processing of digital signals according to the present invention, FIG. 4 schematically shows a number of additional method steps in a variation of the method of the present invention for adjusting signal level thresholds, FIG. 5 schematically shows a device according to a second embodiment of the present invention, and FIG. 6 schematically shows a device according to a third embodiment of the present invention.

The functioning of the present invention will now be described with reference being made to FIG. 1 together with FIG. 3, which shows a flow chart of a number of method steps being taken in a method according to a first variation of the present invention.

A battery signal, signal S, is first received by the device 10 from the transducer 14, step 26, which signal S is thus a time varying signal intended to occupy two logical states at various instances in time. Here the signal S is intended to have one logical state when the contact of the transducer 14 is open and another when this contact is closed. This signal S is obtained through the voltage divider and filter unit 16 dividing down and filtering the voltage across the input ports of the device 10, which is then provided to the amplifier 20. Here the offset adding unit 18 may add an offset O to the signal S. At the amplifier 20 analog measurement of the signal S is performed together with amplification, step 28. The measured analog signal S is then provided to the A/D converter 22, where it is converted from analog to digital representation, step 30. The signal S is thus sampled at various discrete points in time and the amplitude of the various samples is converted to a digital representation, for instance through PCM (pulse code modulation) coding. The digital representation of the signal is thus a digital representation of the amplitude of the samples. These samples are then provided to the processing unit 24, which performs processing according to the principles of the invention.

The first sample of the signal, i.e. the first analog signal level, which is received the first time the device 10 is put to operation, is here compared with a threshold level and if this first analog signal level is above this threshold level one logical state is determined, while if it is below the threshold level, the other logical state is determined. For the rest of the samples, the processing unit 24 investigates if there is a change in the analog signal level, step 32, and if there is not the previous logical state is kept, step 46. This means that the logical state determined for the previous sample remains and is also assigned to the sample that is in the process of being investigated.

If there is a change in the analog signal level for the investigated sample, step 32, the processing unit 24 determines if the change fulfills a number of logical state change conditions, here two, where a first logical state change condition is related to the speed of change of the analog signal level and a second concerns the fact that the analog signal level crosses said level threshold. Here the processing unit 24 first compares the analog signal level of the current sample with the threshold level, step 34, and if this is not crossed, step 36, the previously determined logical state is kept, step 46, while if it is crossed the second condition is fulfilled and the processing unit 24 now continues and investigates the first condition. It thus determines the speed of change in signal level, step 38. This speed of change may be determined through deriving the signal. The processing unit 24 then checks if the change is rapid, typically if the speed of change is above a speed of change threshold. If the speed of change is not rapid, step 40, this indicates that the change was caused by the parasitic resistance RP in the transducer 14, normally because of moisture and/or pollution in the transducer 14. This may then be signaled to control and protection devices in the system, step 44, which may then take appropriate action. Such devices may thus be alerted of the fact that the transducer 14 is faulty. The previous logical state is here also kept for the current sample, step 46. If however the speed of change is rapid, step 40, this is a clear indication of the fact that the first condition is fulfilled, i.e. that there is a change in logical state and therefore a changed logical state is determined for the investigated sample, step 42. In this way the processing unit 24 continues to determine the logical state for the samples of the signal S.

In this way it is possible to determine the correct logical state even though the transducer 14 has ceased to function properly. Through using analog measurements of the input signal S it is furthermore possible to let the first, second and third resistors of the voltage divider and filter unit 16 to have high resistance values and by that reduce the power dissipation of the input resistors.

Here it should be realized that only one of the conditions may be investigated. It is also possible to investigate more conditions. Normally though the first condition is always investigated.

The processing unit 24 may thus here be considered as implementing a means for determining if there is a change in the analog signal level, a means for determining if the change fulfills at least one logical state change condition and a means for determining that there is a change from one logical state to the other if at least one logical state change condition is fulfilled. The means for determining if the change fulfills at least one logical state change condition here includes a means for determining the speed of the change and a means for determining that the first logical state change condition is fulfilled if there is a rapid change and otherwise that it is not. The means for determining at least one logical state change condition furthermore includes a means for comparing the analog signal level with a threshold level and a means for determining that the second logical state change condition exists if the analog signal level crosses the threshold level.

If an offset was added, this offset may here also be measured and if it deviates too much from a nominal offset value, the processing unit 24 may emit an alarm to the control and protection devices indicating that it itself does not function properly. The processing unit 24 may here be considered as implementing a means for comparing the offset with a nominal offset value and a means for determining that there is a fault if the offset deviates from the nominal value.

It should here be realized that the alerting of a faulty transducer may not be made only when the threshold level is crossed. It may be made at other times, such as for instance as soon as a change in signal level is detected or if the signal level crosses a fault indication threshold, which may be appropriately set.

Since the system element, here a battery system, is ungrounded or midpoint grounded, there are some further problems that may occur. The threshold level used for digital signals such as the signal S is a problem in connection with "ungrounded" or "midpoint grounded" battery systems. The detected signal may have a signal level range that varies based on the loading of the battery system. A partly unloaded battery system that is connected thus provides a different signal level than a fully loaded connected battery system. The threshold level therefore often needs to be set low enough to have a secure logical state detection in various situations such as at low battery voltages, when there are long connection cables to the transducers and when using transducers that have voltage drops. At the same time the threshold level can not be set too low as this gives a risk for unintentional logical state determinations at ground faults on the battery system. If for instance the connection between the transducer 14 and the device 10 is subject of a ground fault, the ground fault will cause a transient to occur on the input port. This transient occurring because of a ground fault, which transient may be between 1 and 10 ms long, can here be mistakenly taken to be a regular signal. If the threshold level is set too low, there is therefore a clear risk that the transient caused by the grounding may be interpreted as a logical state indicating a connected battery system. The threshold level on standard detecting devices is furthermore always a compromise.

From the foregoing discussion it is evident that there may be a range of natural signal levels occurring that depend on various circumstances such as the load of the battery system. This means that the signal has a signal level range that is variable in size, which change is furthermore often caused by the status of the element, such as the loading of the battery system. This knowledge can according to the present invention be used in order to avoid an identification of a grounding as a logical state by mistake.

Figure 4:
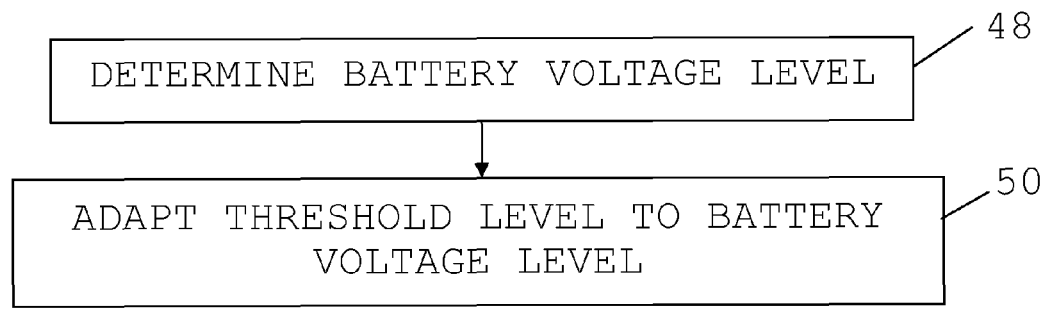

A number of further method steps that may be performed by the processing unit for addressing this situation in a further variation of the present invention is shown in a flow chart in FIG. 4. According to this variation of the present invention, the level threshold used for determining the logical states is variable. The processing unit here determines the size of the signal level range, for instance through determining the battery voltage level, step 48, and then adjusts the threshold level to the battery voltage level, step 50, i.e. adjusts the threshold level in accordance with the size of the signal level range. It is here possible that the threshold level is set for safe detection when the battery is partly unloaded or loaded low and that the threshold level is then raised if the battery system is fully loaded or close to fully loaded. This allows ground faults not to influence signal detection at least when the battery system is fully loaded or close to fully loaded.

The processing unit may here be considered as implementing a means for adjusting the threshold level in accordance with the size of the signal level range.

In this case a rapid change in signal levels that occurs without the threshold level being crossed may furthermore be used to signal a ground fault to protection and control devices of the system.

With the analog measurement the threshold level can thus be chosen as the best possible by adjusting it to the actual battery voltage level. It is here furthermore possible to lower the input filter time of the dividing and filter unit. If this is done an optimised detection level can also be used for secure detection of very fast input signals.

Figure 5:
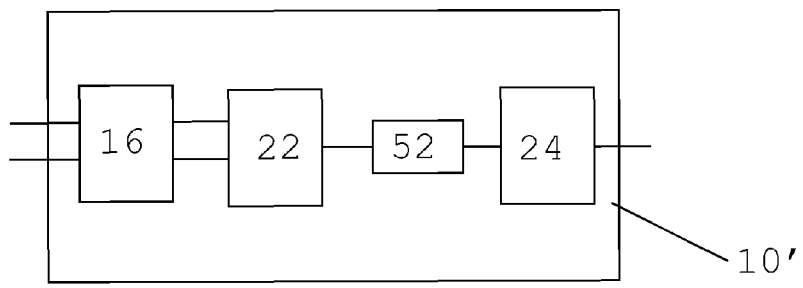

It is possible to change the configuration of the device, as is for instance shown in FIG. 5, which schematically shows a device 10' according to a second embodiment of the present invention. Here the voltage divider and filter unit 16 is connected to the A/D-converter 22, which performs the analog measurements. A digital isolation barrier 52 is here connected between the A/D converter 22 and the processing unit 24. There is thus no isolation amplifier in this embodiment.

Figure 6:
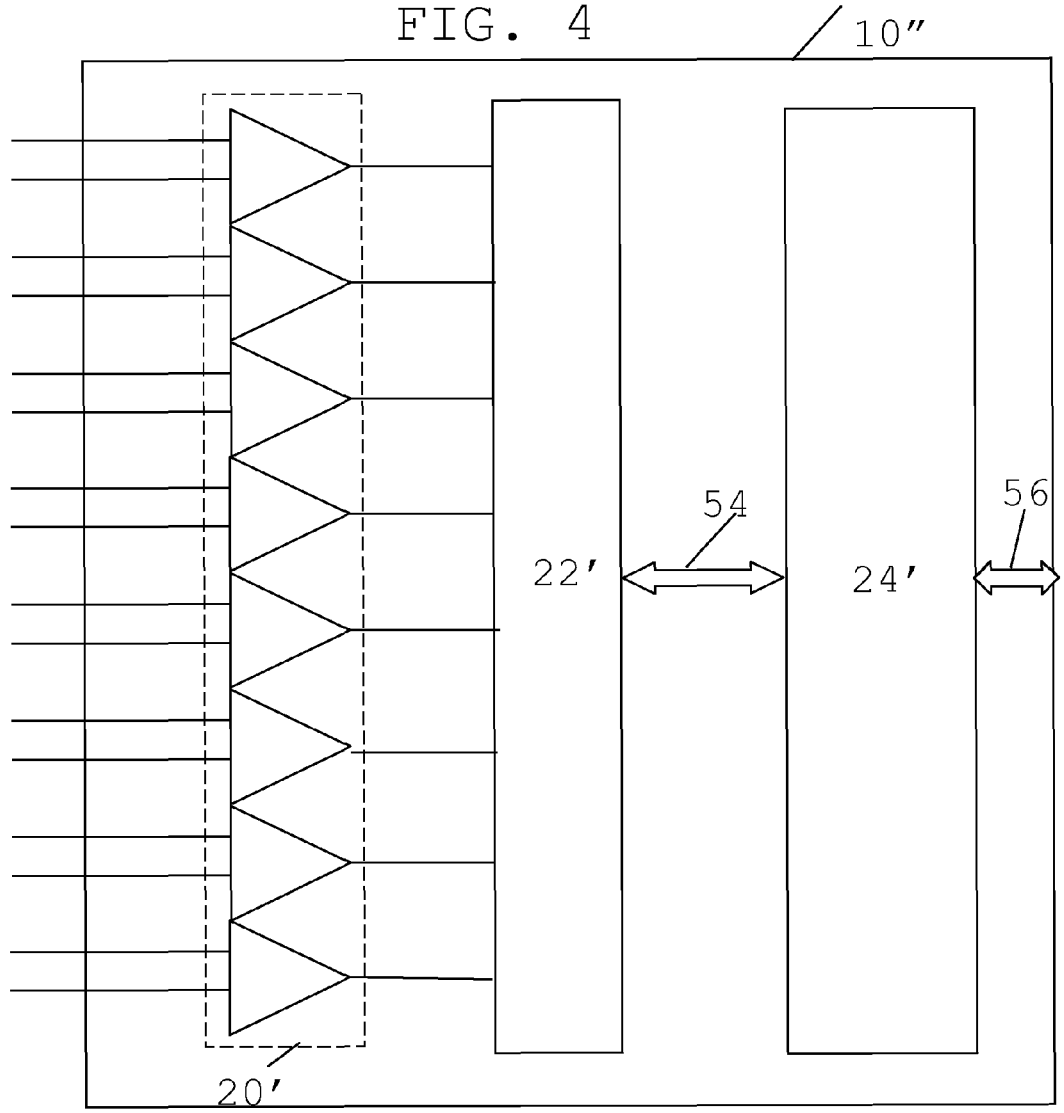

As was mentioned earlier it is because of the use of analog measurements of the input signal possible to let the first, second and third resistors of the voltage divider and filter unit 16 to have high resistance values and by that reduce the power dissipation of these input resistors. This enables handling of several different signals in one device, a digital input board. One example of this is given in FIG. 6, which shows a device 10" based on the principle of the first embodiment. Here the voltage divider and filter units have been omitted. There are here eight isolation amplifiers 20', which may each be fed by DC/DC converters and each receive signals and perform analog measurements on these signals. These amplifiers 20' are connected in parallel to a combined multiplexer and A/D converter 22', which is connected to one processing unit 24' in the form of a CPU via a data bus 54. This CPU 24' here handles all the channels where the signals are provided and may communicate with control and protection devices of the system via an I/O bus 56.

Naturally it is also possible to provide a multi channel device based on the second embodiment. There would then be a corresponding number, here eight, individual A/D converters, each fed by a DC/DC converter, and each being connected via a respective digital isolation barrier to a single CPU, which in turn would communicate with protection and control devices in the system.

The functioning of the present invention provided in the processing unit, may be provided in the form of computer program code performing the function of the unit when being loaded into a program memory of this unit. As an alternative this computer program code may be provided on a data carrier comprising computer program code to make a processing unit, like a CPU, to perform the above-mentioned functions when being loaded into the processing unit. The data carrier may be a moveable data carrier like a CD ROM disc or a memory stick. It may also be a server from which the computer program code may be loaded onto a CPU via a computer network.

The present invention has a number of advantages. It allows very secure detection of signals from signal generating devices, such as transducers, in polluted or moisture areas. It is insensitive to ground faults on ungrounded or midpoint grounded system elements like battery systems. Through providing optimised transition levels the invention also enables very fast detection of input signals. The use of an offset furthermore enables supervision of the device's own functionality. The use of isolation amplifiers and isolator elements has the further advantage of providing a high immunity to EMI (electromagnetic interference).

There are a number of possible variations that can be made to the present invention apart from those already mentioned. It is possible to omit the voltage divider and filter unit, depending on the way the signal is provided. It is possible to check more logical state change conditions. They need furthermore not be combined but may be provided singly. The various types of isolation and amplification being provided may be omitted. Naturally also the signal generation device and the system element causing the signals may be different. The system element may for instance be a circuit breaker.

From the foregoing discussion it is evident that the present invention can be varied in a multitude of ways. It shall consequently be realized that the present invention is only to be limited by the following claims.

The invention claimed is:

1. A method to be carried out in by a processor for processing digital signals with increased reliability, the method comprising:
   receiving a signal intended to occupy two logical states at various instances in time and having an unreliable signal level;

performing an analog measurement of the signal level;
determining if there is a change in the analog signal level;
determining if the change fulfills at least one logical state change condition, wherein a first logical state change condition is based on a speed of change of the analog signal level; and
determining that there is a change in the signal from one of the logical states intended to be occupied to the other logical state intended to be occupied if at least the first logical state change condition is fulfilled, wherein the first logical state change condition is determined to be fulfilled if the speed of change of the analog signal level is above a speed of change threshold.

2. The method according to claim 1, further comprising:
determining that a device delivering the signal is faulty if the speed of change of the analog signal level is below the speed of change threshold.

3. The method according to claim 1, wherein determining the speed of change comprises deriving the analog measured signal.

4. The method according to claim 1, further comprising:
converting the measured signal from an analog to a digital representation;
wherein the following are performed on the digital representation of the analog signal level
determining if there is a change in the analog signal level;
determining if the change fulfills at least one logical state change condition; and
determining if there is a change from one logical state to the other.

5. The method according to claim 1, wherein said step of determining if the change fulfills at least one logical state change condition comprises comparing the analog signal level with a signal level threshold and determining that a second logical state change condition is fulfilled if the analog signal level crosses the signal level threshold.

6. The method according to claim 5, wherein the signal level threshold is adjustable and the measured analog signal has a signal level range that is variable in size, the method further comprising:
adjusting the signal level threshold in accordance with the size of the signal level range.

7. The method according to claim 6, wherein the signal level range varies in size based on the status of an element causing the generation of the signal.

8. The method according to claim 7, wherein the element comprises a battery, and wherein adjusting of the signal level threshold comprises raising the signal level threshold if the battery is fully loaded or close to fully loaded.

9. The method according to claim 1, further comprising:
adding an offset to the measured analog signal;
comparing the offset with a nominal offset value; and
determining whether there is a fault if the offset deviates from the nominal value.

10. The method according to claim 1, wherein the signal indicates a status of a system element, wherein the system element causes the signal to be generated, the method further comprising:
determining whether the status of the system element is reliably reflected by the signal based upon whether at least the first logical state change condition is fulfilled.

11. The method according to claim 10, wherein said system element is a contact of a transducer, which contact can be open or closed, and wherein said signal is intended to have one logical state when the contact of the transducer is open and the other logical state when the contact of the transducer is closed.

12. A device for processing digital signals with increased reliability, the device comprising:
an analog signal measurement module configured to perform analog measurement of a received signal intended to occupy two logical states at various instances in time and having an unreliable signal level;
a first determining module configured to determine if there is a change in the analog signal level;
a second determining module configured to determine if the change fulfills at least one logical state change condition, wherein a first logical state change condition is based on a speed of change of the analog signal level; and
a third determining module configured to determine whether that there is a change in the signal from one of the logical states intended to be occupied to the other logical state intended to be occupied if at least the first logical state change condition is fulfilled, wherein the first logical state change is determined to be fulfilled if the speed of change of the analog signal level is above a speed of change threshold.

13. The device according to claim 12, further comprising:
a fourth determining module configured to determine that a device delivering the signal is faulty if the speed of change of the analog signal level is below the speed of change threshold.

14. The device according to claim 13, wherein all of the determining modules are part of a single integrated module.

15. The device according to claim 12, wherein the device delivering the signal comprises a digital contact transducer.

16. A device according to claim 12, further comprising:
a converter configured to convert the measured signal from an analog to a digital representation, wherein said first determining module, second determining module and third determining module are arranged to perform their operations on the digital representation of the analog signal level.

17. The device according to claim 16, wherein said converter comprises an A/D-converter.

18. The device according to claim 17, wherein said analog signal measurement module comprises said A/D-converter.

19. The device according to claim 18, further comprising:
a digital isolation barrier connected between the A/D converter and the second determining module.

20. The device according to claim 12, wherein the second determining module comprises a comparing module configured to compare the analog signal level with a signal level threshold and a fifth determining module configured to determine that a second logical state change condition is fulfilled if the analog signal level crosses the signal level threshold.

21. The device according to claim 20, wherein the signal level threshold is adjustable and the measured analog signal has a signal level range that is variable in size, the device further comprising:
an adjusting module configured to adjust the signal level threshold in accordance with the size of the signal level range.

22. The device according to claim 21, wherein the signal level range varies in size based on the status of an element causing the generation of the signal.

23. The device according to claim 22, wherein the element is a battery system and the adjusting module is arranged to raise the signal level threshold if the battery is fully loaded or close to fully loaded.

24. The device according to claim 12, further comprising:
an adding module configured to add an offset to the measured signal;

a comparing module configured to compare the offset with a nominal offset value; and a fourth determining module configured to determine that there is a fault if the offset deviates from the nominal value.

25. The device according to claim 12, wherein said analog signal measurement module comprises an isolation amplifier.

26. The device according to claim 12, wherein said first determining module, said second determining module and said third determining module are jointly implemented in a CPU.

27. The device according to claim 12, wherein all of the determining modules are part of a single integrated module.

28. A computer program product provided on a data carrier for processing digital signals with increased reliability and computer program code to make a processing unit perform a method when said code is loaded into said processing unit, the method comprising:

receiving a signal intended to occupy two logical states at various instances in time and having an unreliable signal level;

performing an analog measurement of the signal level;

determining if there is a change in the analog signal level;

determining if the change fulfills at least one logical state change condition, wherein a first logical state change condition is based on a speed of change of the analog signal level; and determining that there is a change in the signal from one of the logical states intended to be occupied to the other logical state intended to be occupied if at least the first logical state change condition is fulfilled, wherein the first logical state change condition is determined to be fulfilled if the speed of change of the analog signal level is above a speed of change threshold.

\* \* \* \* \*